US006467152B1

(12) United States Patent
De Los Santos et al.

(10) Patent No.: US 6,467,152 B1
(45) Date of Patent: Oct. 22, 2002

(54) METHOD OF FABRICATING A MICROWAVE MICROSTRIP/WAVEGUIDE TRANSITION STRUCTURE

(75) Inventors: Hector J. De Los Santos, Del Aire; Yu-Hua Kao Lin, Oak Park; Andrew H. Kwon, Thousand Oaks; Eric D. Ditmars, Redondo Beach; John R. Dunwoody, Los Angeles, all of CA (US)

(73) Assignee: Hughes Electronics Corp., Los Angeles, CA (US)

( * ) Notice: Subject to any disclaimer, the term of this patent is extended or adjusted under 35 U.S.C. 154(b) by 0 days.

(21) Appl. No.: 09/460,184

(22) Filed: Dec. 11, 1999

(51) Int. Cl.[7] .......................... H01Q 17/00; H05K 3/30; B29D 11/00

(52) U.S. Cl. ............................ 29/601; 29/600; 29/832; 29/847; 333/246; 333/247; 333/248; 333/250; 216/24; 216/41; 257/275; 257/728

(58) Field of Search ....................... 29/600, 601, 25.35, 29/832, 854, 847, 527.2; 333/26, 247, 248, 246, 250; 216/24, 41, 49; 257/728, 275, 684

(56) References Cited

U.S. PATENT DOCUMENTS

| | | | | | |
|---|---|---|---|---|---|
| 5,219,377 | A | * | 6/1993 | Poradish | 29/832 |
| 5,525,190 | A | * | 6/1996 | Wojnarowski et al. | 216/24 |
| 5,608,263 | A | | 3/1997 | Drayton et al. | 257/728 |

FOREIGN PATENT DOCUMENTS

| | | | | |
|---|---|---|---|---|
| JP | 64-77521 | * | 3/1989 | 216/41 |

* cited by examiner

*Primary Examiner*—Peter Vo
*Assistant Examiner*—A. Dexter Tugbang

(57) ABSTRACT

A microwave microstrip/waveguide transition structure includes a substrate, an elongated microstrip layer residing on a surface of the substrate, and an elongated integral hollow waveguide on the surface of the substrate. The microstrip layer and a side of the hollow waveguide constitute a single continuous piece of metal. The transition structure is fabricated by providing a substrate, depositing a metallic layer on the substrate, and depositing a metallic hollow housing continuous with a portion of a length of the metallic layer. The metallic hollow waveguide bounded by the metallic layer and the metallic hollow housing and having a contained volume therewithin is thereby defined.

17 Claims, 3 Drawing Sheets

METHOD OF FABRICATING A MICROWAVE MICROSTRIP/WAVEGUIDE TRANSITION STRUCTURE

BACKGROUND OF THE INVENTION

This invention relates to microwave devices, and, more particularly, to a transition structure between a microstrip and a waveguide.

Microwaves are high-frequency electromagnetic signals that typically have frequencies in the 0.9–120 GHz (gigahertz) range. Microwaves may be propagated in several ways, including through free space and in or along confined carriers. Examples of confined carriers are solid metallic conductors and hollow waveguides. A microwave is propagated along the surface of a solid metallic conductor. A microwave is propagated through space but within a confined volume in a waveguide.

The selection of the best propagation path of the microwave involves a variety of considerations. However, in many microwave systems it is necessary to perform transitions of the propagation path. For example, antennas are used to receive or send microwave signals through free space and, thence, perform the transition to or from the confined carrier. In other cases such as within microwave amplifiers or other electronic signal processing equipment, the propagation of microwave signals must undergo transitions between solid conductors and waveguides.

Microwave transitions between solid conductors and waveguides (either solid conductor-to-waveguide or waveguide-to-solid conductor) have historically been accomplished with a physical interpenetration of the two. For example, a solid conductor may penetrate into the interior of a waveguide perpendicular to the direction of propagation of the microwave within the waveguide.

For many microwave systems, such as communications satellites, it is important to reduce the size and weight of microwave systems. Microwave systems with small solid conductors, termed microstrips or striplines, have been developed to produce microwave circuitry in planar configurations and to reduce the size of the microwave electronic circuitry to a size approaching that of microelectronic devices operating at conventional frequencies. The configuring of microstrip/waveguide transitions is more difficult in microwave circuitry of this type.

Microwave processing circuitry and microstrip/waveguide transitions have been integrated into "micromachined" devices such as those disclosed in U.S. Pat. No. 5,608,263. The micromachined architecture, while operable, offers opportunities for improvement. These existing microelectronic transition structures are difficult to handle and are not conducive to the production of large numbers of identical devices by batch processing. They require considerable care in the alignment of matching structures.

There is a need for an improved approach to the fabrication of a microstrip/waveguide transition structure that overcomes the drawbacks of the existing devices, and still permits the incorporation of circuitry for microwave signal processing. The present invention fulfills this need and provides additional related advantages.

SUMMARY OF THE INVENTION

The present approach provides a microwave microstrip/waveguide transition structure and a method for making such a structure. The transition structure permits active or passive microwave devices to be incorporated into the transition structure. The microwave device is substantially planar, except for the necessary thickness to accommodate the waveguide. The fabrication technique is fully compatible with microelectronic fabrication technology and permits the use of batch processing techniques. No alignment of separate subassemblies is required.

In accordance with the invention, a microwave microstrip/waveguide transition structure comprises a substrate, an elongated microstrip layer residing on a surface of the substrate, and an elongated integral hollow waveguide having a side, the waveguide residing on the surface of the substrate. The microstrip layer and the side of the hollow waveguide comprise a single continuous piece of metal, which may be elongated in a common direction.

One embodiment of the microwave microstrip/waveguide transition structure may also be described as comprising a single substrate, a microstrip layer residing on a surface of the single substrate, and an integral hollow waveguide residing on the surface of the single substrate. The microstrip layer and the hollow waveguide comprise a single continuous piece of metal and are each elongated in a common direction.

In any of these embodiments, an electronic device may be affixed to the substrate and/or disposed within the interior of the waveguide. The waveguide is normally rectangular in cross section, but may be of any operable shape. One side of the waveguide contacts the substrate, and is contiguous with the microstrip layer. The microstrip layer may be of any operable thickness and width, and the width typically increases from a small value remote from the waveguide to the width of the contiguous waveguide wall as the microstrip layer transitions into the waveguide wall.

The materials of construction may be selected from many different operable materials. The substrate may be, for example, a ceramic or a glass. The microstrip layer and waveguide may be made of metals such as titanium-tungsten plated with gold, chromium plated with gold, or chromium-copper plated with gold.

A method of making a microwave microstrip/waveguide transition structure comprises the steps of providing a substrate, depositing a metallic layer on the substrate, and depositing a metallic hollow housing continuous with a portion of a length of the metallic layer, thereby defining a metallic hollow waveguide bounded by the metallic layer and the metallic hollow housing and having a contained volume therewithin.

The waveguide is desirably formed integral with the microstrip by depositing a layer of metal over the substrate, and then a patterned layer of photoresist material overlying a portion of the length of metal. Additional metal deposited over the photoresist forms a three-dimensional metallic structure, overlying and enclosing the photoresist core. Openings are made through the metallic structure, to permit the photoresist to be removed thermally, chemically, or otherwise. The result is the hollow, precisely dimensioned waveguide continuous with the microstrip. The transition is accomplished along the length of the transition structure. If desired, microwave processing devices may also be deposited on the substrate, either inside or outside of the interior of the waveguide, in an appropriate sequence with the formation of the hollow waveguide.

The microwave microstrip/waveguide transition structure of the invention thus uses a single structure to accomplish the transition in a planar, lightweight configuration. It is not required to fabricate separate parts and then register and attach the parts together, which is often difficult when the parts are very small. Large numbers of the transition structures may be fabricated in batch-processing operations. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
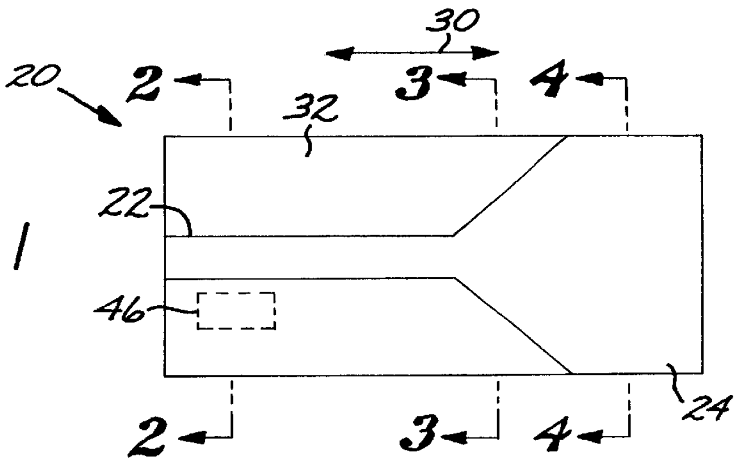
FIG. 1 is a schematic plan view of a microstrip/waveguide transition structure.

FIGS. 1–4 illustrate a microwave microstrip/waveguide transition structure 20, which permits the transition of microwave signals from a microstrip 22 to a waveguide 24, or from the waveguide 24 to the microstrip 22. The microstrip 22 is an elongated strip of metal, and the waveguide 24 is an elongated hollow structure, formed of metal walls 26. The metal walls 26 define a hollow volume 28. The microstrip 22 and the waveguide 24 are each elongated, preferably but not necessarily parallel to a common direction of elongation 30.

Figure 2:
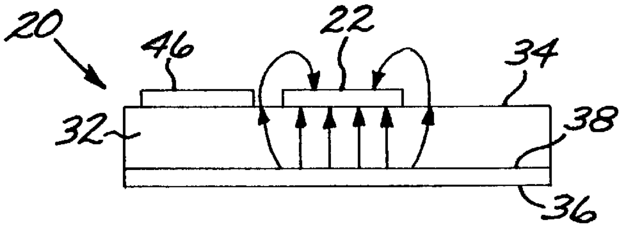
FIG. 2 is a schematic sectional view of the transition structure of FIG. 1, taken along line 2—2.
Figure 3:
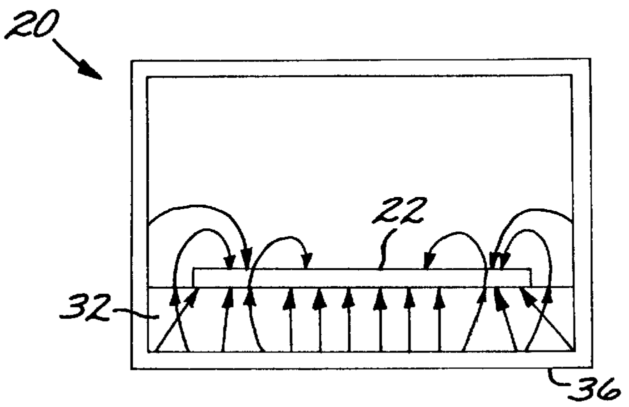
FIG. 3 is a schematic sectional view of the transition structure of FIG. 1, taken along line 3—3.
Figure 4:
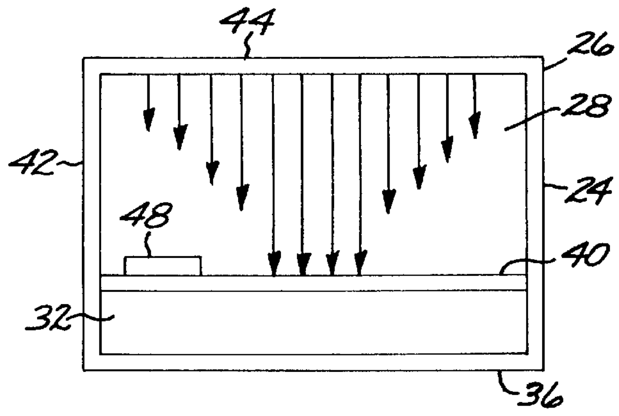
FIG. 4 is a schematic sectional view of the transition structure of FIG. 1, taken along line 4—4.

FIGS. 2–4 show the structure of the transition structure 20 at sections 2—2, 3—3, and 4—4, respectively, of FIG. 1. Section 2—2 is taken at a location where the microwave signal is propagated through the microstrip 22. Section 4—4 is taken at a location where the microwave signal is propagated through the waveguide 24. Section 3—3 is taken at an intermediate location where the microstrip 22 and the waveguide 24 meld together in a contiguous and continuous fashion so that the microstrip 22 and the waveguide 24 are integral with each other. In each of FIGS. 2–4, arrows represent electrical field (E-field) vectors associated with the conductor of the microwave at the respective sections.

The transition structure 20 includes a substrate 32 upon which the microstrip 22 and the waveguide 24 reside. The substrate 32 is desirably a ceramic such as aluminum oxide, or a glass. In a typical case, the substrate 32 is about 0.010 inch thick, and of sufficient lateral and length extent to accommodate the transition structure. There is a single substrate 32, in contrast to the structure illustrated in U.S. Pat. No. 5,608,263, which requires two overlying substrates that are fabricated separately and must be superimposed in registry during assembly of the structure.

In the all-microstrip region illustrated in FIG. 2, the metallic layer which forms the microstrip 22 lies on and contacts a top side 34 of the substrate 32. A metallic ground plane 36 lies on an oppositely disposed bottom side 38 of the substrate 32. The metal of the metallic microstrip 22 may be of any operable type, and is preferably an alloy of 10 weight percent titanium-90 weight percent tungsten alloy with an overlying gold protective layer ("TiW—Au"). Other metals such as chromium metal with a gold coating ("Cr—Au") or chromium-copper metal with a gold coating ("CrCu—Au") may be used for the microstrip 22.

In the all-waveguide region illustrated in FIG. 4, the metallic layer is widened to define a bottom wall 40. The microstrip 22 and the bottom wall 40 are continuous, and both reside on and contact the substrate 32. Side walls 42 and a top wall 44 are provided. The bottom wall 40, the side walls 42, and the top wall 44 are integral, and together define the closed hollow volume 28. The substrate 32 is not within this volume 28, although the substrate 32 is contained within a separate and adjacent volume defined by the ground plane 36, the side walls 42, and the bottom wall 40.

In the intermediate region illustrated in FIG. 3, the microstrip 22 lies on the substrate 32 and is present as a separate entity not yet joined to the side walls 42. The side walls 42, the top wall 44, and the ground plane 36 are all present and define a hollow volume in which the substrate 32 and the microstrip 22 are contained.

An inspection of FIGS. 2–4 shows the continuous progression from the microstrip-only region of FIG. 2, through the intermediate region of FIG. 3 which is neither purely microstrip nor purely waveguide, to the waveguide-only region of FIG. 4.

Other structures and/or devices may optionally be affixed to the substrate 32 as part of the transition structure 20. FIG. 2 illustrates an "exterior" device 46 affixed to a surface of the substrate 32 so as to be exteriorly visible. FIG. 4 illustrates an "interior" device 48 fixed to the substrate 32 through the bottom wall 40, which is not exteriorly visible. The devices 46 and 48 may be any operable type of active or passive signal processing device, such as a signal amplifier for example. The structures of such devices are known in the art. They are typically deposited onto the substrate 32 by microelectronic techniques at appropriate stages of the fabrication of the transition structure 20.

Figure 5:
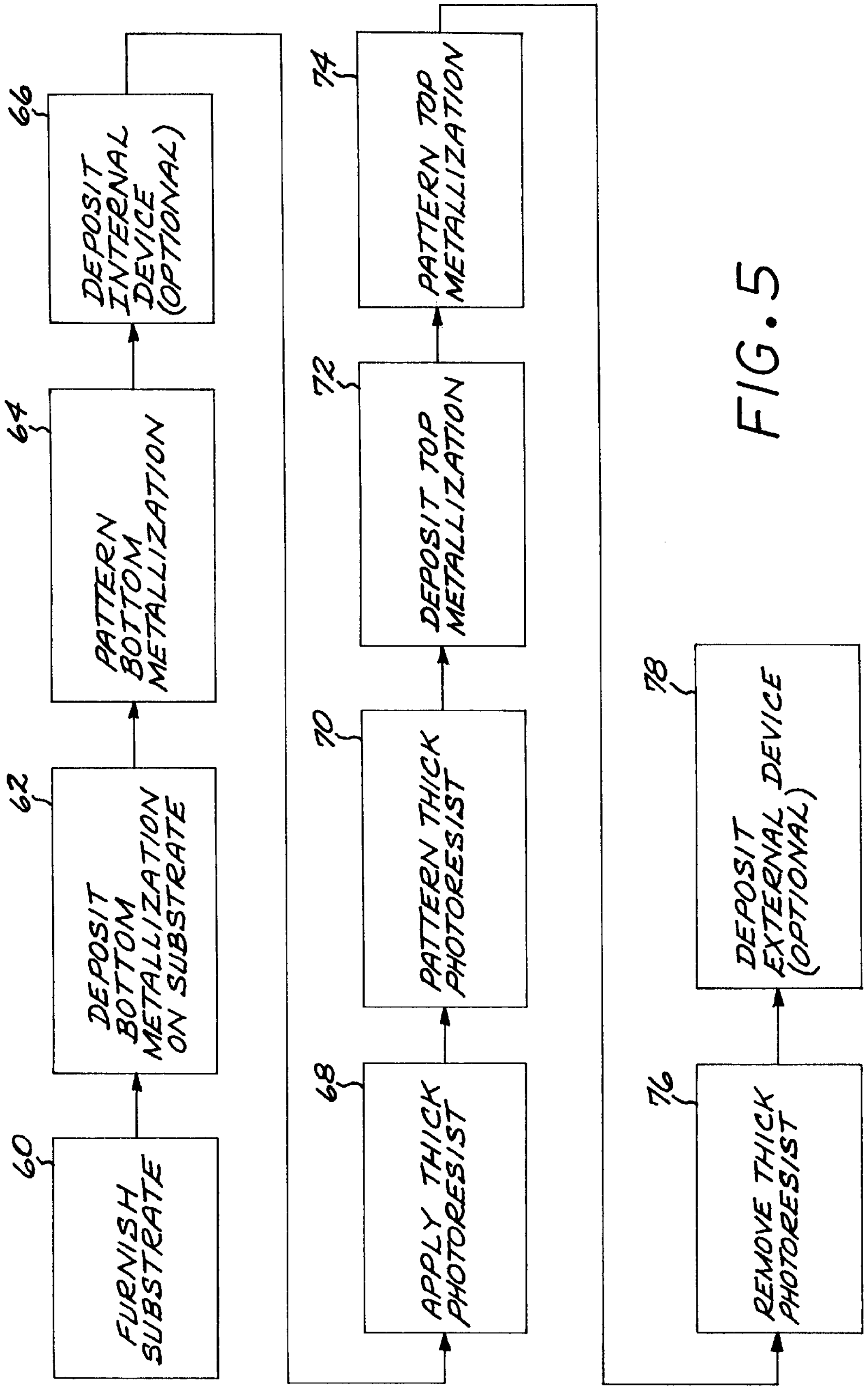
FIG. 5 is a block flow diagram of a fabrication method according to the invention.
Figure 6:
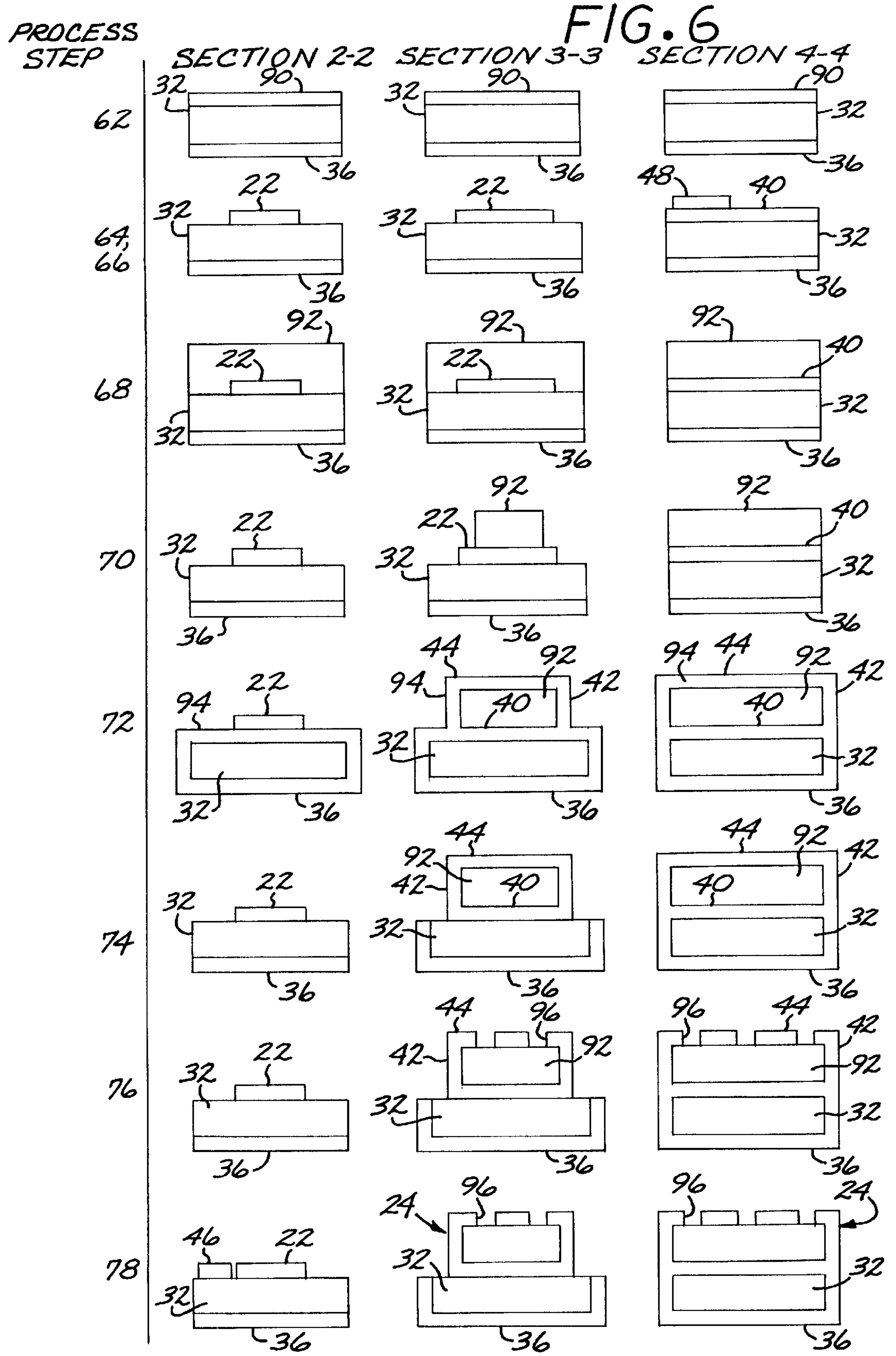
FIG. 6 is a schematic structural flow diagram illustrating the development of the structures at sections 2—2, 3—3, and 4—4 of FIG. 1 during the fabrication sequence of FIG. 5.

FIG. 5 is a block flow diagram of a preferred approach for fabricating the transition structure 20. FIG. 6 is a pictorial flow diagram for each of the three sections 2—2, 3—3, and 4—4, whose structures are developed in parallel. The corresponding structures are indicated in FIG. 6 which are associated with the various process steps in FIG. 5.

The substrate 32 is provided, numeral 60. The substrate 32 is a piece of an operable electrical nonconductor such as a ceramic or a glass, typically from about 0.01 inch to about 0.025 inch thick and sufficiently large to receive the subsequently deposited elements thereon.

A bottom metallization 90 is deposited on the top side 34 of the substrate 32, numeral 62. (It is termed a "bottom metallization" because it eventually forms the bottom of the waveguide 24.) The bottom metallization 90 is a metal such as an alloy of titanium and tungsten, preferably having a composition of 10 weight percent titanium-90 weight percent tungsten, with a gold coating ("TiW—Au"). The bottom metallization 90 is preferably from about 1 micrometer to about 2 micrometers thick. Other metals such as chromium metal with a gold coating ("Cr—Au") or chromium-copper metal with a gold coating ("CrCu—Au") may be used for the bottom metallization. The bottom metallization 90 is deposited by any operable technique. It is preferably deposited by sputtering or electroplating, but other techniques may also be used. Preferably, in the same process step 62 the ground plane 36 is deposited on the opposite bottom side 38 of the substrate 32. The ground plane 36 is preferably the same material and the same thickness as the bottom metallization 90, and is deposited by the same technique. The bottom metallization 90 and the ground plane 36 are preferably deposited over substantially the entire top side 34 and bottom side 38 of the substrate 32, respectively.

The bottom metallization is patterned, numeral 64. The patterning accomplishes a progressive narrowing of the bottom metallization 90, to form what ultimately becomes the microstrip 22 in section 2—2, the transition microstrip 22 in section 3—3, and the bottom wall 40 in section 4—4. The patterning is accomplished by conventional photolithography and etching using any operable procedures.

Any interior device 48 that is to be within the interior of the waveguide 24 in the final transition structure 20 is optionally deposited overlying the bottom wall 40, numeral 66. The interior device 48, if any, is deposited using any technique that is appropriate to the nature of the interior device 48. The interior device 48 is not shown in the subsequent portions of FIG. 6 for clarity and because its presence is optional.

A thick photoresist 92 is applied over the elements previously deposited on the top side 34 of the substrate 32, numeral 68, typically by spin coating. The thick photoresist may be any viscous positive photoresist, for example SJR 5740. The photoresist 92 defines the interior height of the hollow volume 28 in the final transition structure 20, and its thickness is selected accordingly.

The thick photoresist 92 is patterned, numeral 70, using conventional photolithography and development techniques, as required by the selected photoresist. The photoresist is removed in the area of the pure microstrip, section 2—2. The remaining photoresist in sections 3—3 and 4—4 defines the lateral position of subsequently deposited side walls and is patterned accordingly. The height and width of the hollow volume 28 is typically selected according to the wavelength of the microwaves that are to be transmitted, according to principles known in the art. For example, to transmit a microwave of a frequency of 110 GHz, the hollow volume 28 typically has an interior width of about 0.100 inch and an interior height of about 0.050 inch.

A top metallization 94 is deposited, numeral 72. The top metallization serves to make the exposed portion of the microstrip 22 thicker in section 2—2. However, in sections 3—3 and 4—4, where the thick photoresist 92 is present, the top metallization 94 defines the side walls 42 and the top wall 44 of the waveguide. The top metallization 94 is preferably but not necessarily the same material used to deposit the bottom metallization 90, and the same deposition technique may be used.

The top metallization 94 is patterned by conventional photolithography and etching, numeral 74. The patterning removes excess top metallization that would produce electrical shorts between the waveguide 24 and the ground plane 36 and other structure in the final transition structure 20.

At this point, the microstrip 22 has been formed in section 2—2. The waveguide 24 has also been formed in section 4—4 continuous with the microstrip 22 through the intermediate structure of section 3—3. The bottom wall 40, side walls 42, and top wall 44 are continuous metallic structures forming the waveguide 24. There remains, however, the problem that the interior of the waveguide 24 is filled with the thick photoresist 92, which must be removed to permit the waveguide to function.

The photoresist 92 is removed by forming a pattern of small openings 96 through the wall of the waveguide 24, numeral 76. The openings 96 are preferably formed in the top wall 44 of the waveguide 24. The openings 96 are desirably much smaller in lateral extent than the wavelength of the microwave signals that are to be propagated using the transition structure 22. The openings 96 are conveniently formed by patterning the top wall 44 using conventional photolithography and etching techniques.

The thick photoresist within the interior of the walls 26 is thereby exposed, and may be removed by any operable technique such as chemical dissolution (i.e., wet etching) or dry plasma etching, depending upon the nature of the thick photoresist.

The openings 96, which are much smaller than the wavelength of the microwave signals, do not interfere with the propagation of the microwave signals. The openings 96 are therefore allowed to remain in the final transition structure 20. Optionally, they could be closed off if desired.

Any exterior device 46 that is to be outside of the interior of the waveguide 24 in the final transition structure 20 is optionally deposited overlying the substrate 32, numeral 78. The exterior device 46, if any, is deposited using any technique that is appropriate to the nature of the exterior device 46.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of making a microwave microstrip/waveguide transition structure, comprising the steps of:

providing a substrate;

depositing an elongated metallic layer on the substrate, a first length of the metallic layer comprising a microwave microstrip portion and a second length of the metallic layer comprising microwave waveguide portion; and depositing a metallic hollow microwave waveguide housing upon, continuous with, and integral with the microwave waveguide portion of the first length of the metallic layer, thereby defining a metallic hollow microwave waveguide bounded by the microwave waveguide portion of the metallic layer and the metallic hollow microwave housing and having a contained volume therewithin, the microwave waveguide being integral with the microwave microstrip portion of the metallic layer.

2. The method of claim 1, wherein the metallic layer has a layer length, and the waveguide has a waveguide length less than the layer length.

3. The method of claim 1, including an additional step of:

fixing an electronic device to the substrate.

4. The method of claim 1, including an additional step of:

disposing an electronic device within the waveguide.

5. The method of claim 1, wherein the step of depositing a metallic layer includes the step of depositing the metallic layer with a width that varies from a narrower width in the microstrip portion to a wider width in the waveguide portion continuous with the metallic housing.

6. The method of claim 1, wherein the step of depositing a metallic hollow housing includes the step of depositing a photoresist material overlying the metallic layer;

patterning and developing the photoresist material to define a pattern for the metallic hollow housing;

depositing the metallic hollow housing overlying the patterned and developed photoresist material, continuous with the metallic layer; and removing the photoresist material from within the waveguide.

7. The method of claim 6, wherein the step of removing includes the step of forming an opening through the metallic hollow housing; and removing the photoresist material through the opening.

8. A method of making a microwave microstrip/waveguide transition structure, comprising the steps of:

providing a substrate;

depositing a metallic layer on the substrate, wherein the step of depositing the metallic layer includes the step of depositing the metallic layer with a width that varies from a narrower width in a microstrip portion to a wider width in a waveguide portion continuous with the metallic housing; and depositing a metallic hollow housing continuous with a portion of a length of the metallic layer, thereby defining a metallic hollow waveguide bounded by the metallic layer and the metallic hollow housing and having a contained volume therewithin.

9. The method of claim 8, wherein the metallic layer has a layer length, and the waveguide has a waveguide length less than the layer length.

10. The method of claim 8, including an additional step of:

fixing an electronic device to the substrate.

11. The method of claim 8, including an additional step of:

disposing an electronic device within the waveguide.

12. A method of making a microwave microstrip/waveguide transition structure, comprising the steps of:

providing a substrate;

depositing a metallic layer on the substrate; and depositing a metallic hollow housing continuous with a portion of a length of the metallic layer, thereby defining a metallic hollow waveguide bounded by the metallic layer and the metallic hollow housing and having a contained volume therewithin, wherein the step of depositing the metallic hollow housing includes the step of depositing a photoresist material overlying the metallic layer;

patterning and developing the photoresist material to define a pattern for the metallic hollow housing;

depositing the metallic hollow housing overlying the patterned and developed photoresist material, continuous with the metallic layer; and removing the photoresist material from within the waveguide.

13. The method of claim 12, wherein the step of removing includes the step of forming an opening through the metallic hollow housing; and removing the photoresist material through the opening.

14. The method of claim 12, wherein the metallic layer has a layer length, and the waveguide has a waveguide length less than the layer length.

15. The method of claim 12, including an additional step of:

fixing an electronic device to the substrate.

16. The method of claim 12, including an additional step of:

disposing an electronic device within the waveguide.

17. The method of claim 12, wherein the step of depositing a metallic layer includes the step of depositing the metallic layer with a width that varies from a narrower width in a microstrip portion to a wider width in a waveguide portion continuous with the metallic housing.

* * * * *